(12) United States Patent
Shen et al.

(10) Patent No.: US 7,342,844 B2
(45) Date of Patent: Mar. 11, 2008

(54) POWER ON SEQUENCE FOR A FLASH MEMORY DEVICE

(75) Inventors: Jian-Yuan Shen, Taichung (TW); Chi-Ling Chu, Taichung County (TW); Chou-Ying Yang, Changhua County (TW)

(73) Assignee: Macronix International Co., Ltd. (TW)

( * ) Notice: Subject to any disclaimer, the term of this patent is extended or adjusted under 35 U.S.C. 154(b) by 14 days.

(21) Appl. No.: 11/462,257

(22) Filed: Aug. 3, 2006

(65) Prior Publication Data
US 2008/0031070 A1   Feb. 7, 2008

(51) Int. Cl.
*G11C 7/00* (2006.01)
(52) U.S. Cl. ........................ 365/226; 365/201
(58) Field of Classification Search ............... 365/226, 365/201, 227, 228
See application file for complete search history.

(56) References Cited

U.S. PATENT DOCUMENTS

| 6,654,272 | B2 | 11/2003 | Santin et al. | |
| 6,845,029 | B2 | 1/2005 | Santin et al. | |
| 7,234,099 | B2* | 6/2007 | Gower et al. | 714/767 |
| 2006/0242541 | A1* | 10/2006 | Gower et al. | 714/767 |

* cited by examiner

*Primary Examiner*—Vu A. Le
(74) *Attorney, Agent, or Firm*—Akin Gump Strauss Hauer & Feld LLP

(57) ABSTRACT

A method of performing a power on sequence for a flash memory includes applying device voltage to the flash memory and performing an error bit check on at least one memory cell in the flash memory during initial power up. The at least one memory cell in the flash memory is read only after the error bit check determines that the device voltage is stable. The data read from the at least one memory cell is loaded to an information register.

14 Claims, 4 Drawing Sheets

POWER ON SEQUENCE FOR A FLASH MEMORY DEVICE

BACKGROUND OF THE INVENTION

The present invention relates to a power on sequence for a non-volatile memory semiconductor device, and more particularly, to a power on sequence for a flash memory device that includes error bit check before reading data.

Non-volatile memory ("NVM") refers to semiconductor memory which is able to continually store information even when the supply of electricity is removed from the device containing such an NVM. NVM includes Mask Read-Only Memory (Mask ROM), Programmable Read-Only Memory (PROM), Erasable Programmable Read-Only Memory (EPROM) and Electrically Erasable Programmable Read-Only Memory (EEPROM). Flash memory is also a type of NVM which may be considered an EEPROM.

Flash memory cells often use a floating-gate transistor including a source, a drain, a floating-gate layer and a control-gate layer. Access operations are carried out by applying biases to each of these respective terminals. Write operations are generally carried out by channel hot electron injection (CHE). The CHE process induces a flow of electrons between the source and the drain, and accelerates them toward a floating gate in response to a positive bias applied to the control gate. Erase operations are generally carried out through Fowler-Nordheim (FN) tunneling. The erase process may include electrically floating the drain, grounding the source and applying a high negative voltage to the control gate. Read operations generally include sensing a current between the source and the drain in response to a bias applied to the control gate. If the memory cell is programmed, the cell's threshold voltage will be near or above the control-gate bias such that the resulting current is low. If the memory cell is erased, the cell's threshold voltage is well below the control-gate bias such that the current is substantially higher. Other programming, erasing and reading techniques are known in the art.

FIG. 1 shows a basic flash memory device 100 for coupling to a processor or other controller U1. The flash memory device 100 includes a flash array 102, a row decoder 104 and a column decoder 106. The flash array 102 includes a plurality of rows and columns of memory cells accessible for reading, programming and erasing by the combination of the row and column decoders 104, 106. An address buffer 108 is coupled to an address pad 110 for receiving address information and applying the address information to the row and column decoders 104, 106. A sense amplifier 112 senses and amplifies data stored in the individual memory cells within the flash array 102. A data buffer 114 buffers the data received from the sense amplifier 112 and output to a data pad 116. A command control circuit 118 decodes information received from a control pad 120 and a power on reset (POR) pad 122. The command control circuit 118 controls data read, data write and erase operations in the flash memory device 100. Data read from the flash memory array can be selectively written to an information register 124 via a data bus 126.

There are more and more functions in devices containing flash memory which require auto loading of information stored by non-volatile cells in an information array 102a to the information register 124 during a power on sequence or power-up of the flash memory device 100. The non-volatile cells of the information array 102a are also within the flash memory device 100, and the information stored therein is typically important for some control functions. The data stored in the non-volatile cells of the information array 102a can be programmed, erased and read by using the same data path as the rest of a normal flash array 102.

FIG. 2 is a graph depicting device voltage versus time for a conventional power on sequence of a flash memory array 102. As shown, when the device voltage reaches the minimum value, e.g., 1.8 V, the power on reset (POR) stops and an immediate read of data from the memory array 102 may not be stable. The normal logic low value is higher than the minimum logic low value, e.g., approximately 3 V for normal versus 1.8 V for the minimum logic low value.

It is desirable to provide a power on sequence for a non-volatile memory semiconductor device. It is also desirable to provide power on sequence for a flash memory device that includes error bit check before reading data. It is desirable to ensure that a flash memory device has reached a stable voltage during a power on sequence by performing an error bit check before reading data stored in cells of the flash memory device.

BRIEF SUMMARY OF THE INVENTION

Briefly stated, an embodiment of the present invention comprises a method of performing a power on sequence for a flash memory that includes applying device voltage to the flash memory and performing an error bit check on at least one memory cell in the flash memory during initial power up. The at least one memory cell in the flash memory is read only after the error bit check determines that the device voltage is high enough. The data read from the at least one memory cell is loaded to an information register.

Another embodiment of the present invention comprises a method of performing a power on sequence for a flash memory that includes applying device voltage to the flash memory and performing an error bit check on a plurality of memory cells in the flash memory during initial power up. The plurality of memory cells in the flash memory are read only after the error bit check determines that the device voltage is high enough. The data read from the plurality of memory cells are loaded to one or more information registers.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
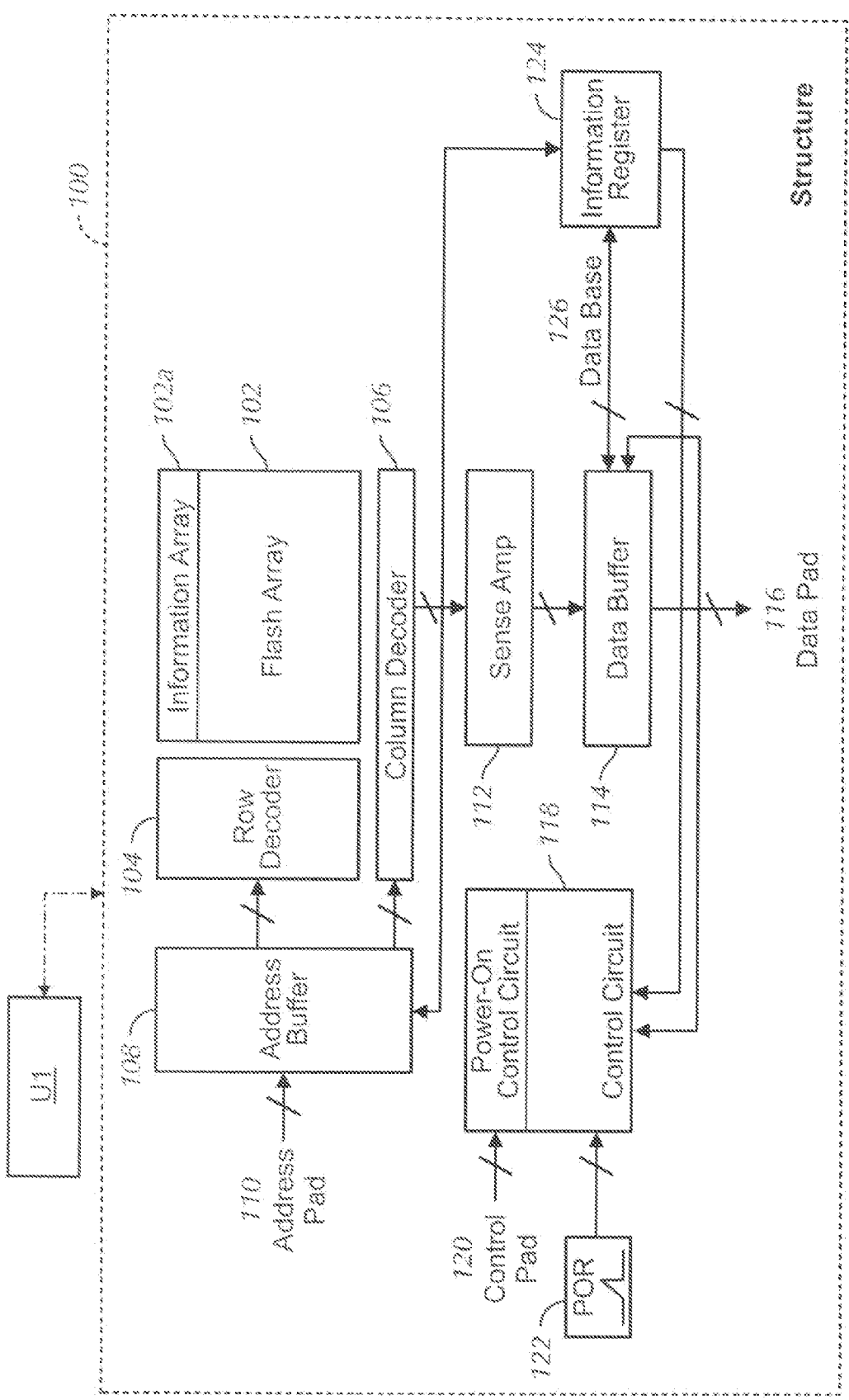
FIG. 1 is a functional block diagram of a basic conventional flash memory device for coupling to a processor.
Figure 2:
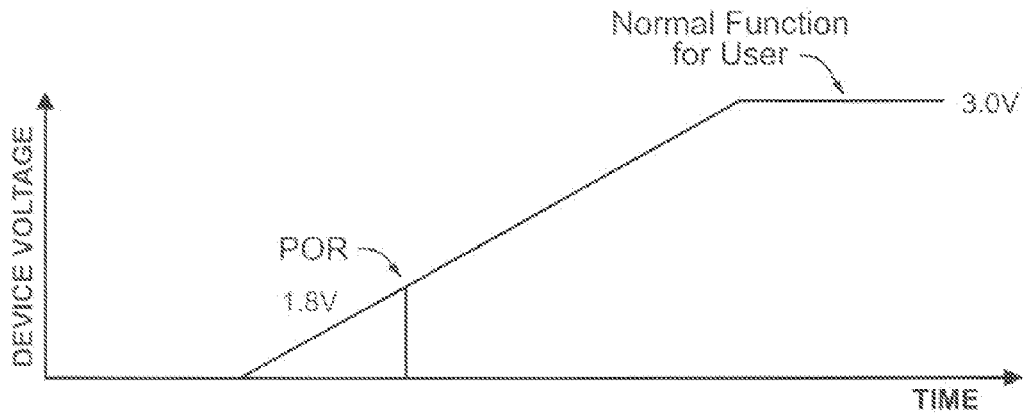
FIG. 2 is a graph depicting device voltage versus time of a conventional power on sequence for a flash memory device.

Certain terminology is used in the following description for convenience only and is not limiting. The words "right", "left", "lower", and "upper" designate directions in the drawing to which reference is made. The words "inwardly" and "outwardly" refer to directions toward and away from, respectively, the geometric center of the object described and designated parts thereof. The terminology includes the words above specifically mentioned, derivatives thereof and words of similar import. Additionally, the words "a" and "an," as used in the claims and in the corresponding portions of the specification, mean "at least one."

Figure 3:
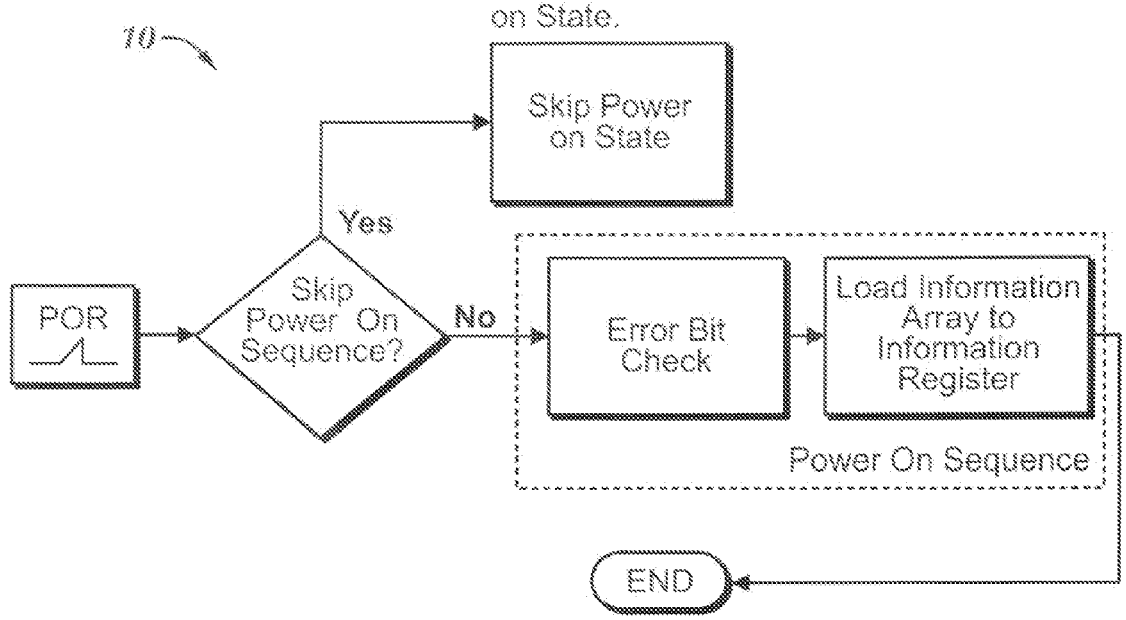
FIG. 3 is a flow chart of a power on sequence for a memory array in accordance with a preferred embodiment of the present invention.

Referring to the drawings in detail where like element numbers reference like elements throughout, FIG. 3 shows a flow chart of a power on sequence 10 for a flash memory array 102 in accordance with a preferred embodiment of the present invention. The method of performing the power on sequence 10 for a flash memory device 100 includes applying device voltage to the flash memory 100 and performing an error bit check on at least one memory cell in the flash memory array 102 during initial power up or after power on reset (POR). The at least one memory cell in the flash memory array 102 is read only after the error bit check determines that the device voltage is stable. The data read from the at least one memory cell is then loaded to an information register 124.

Figure 6:
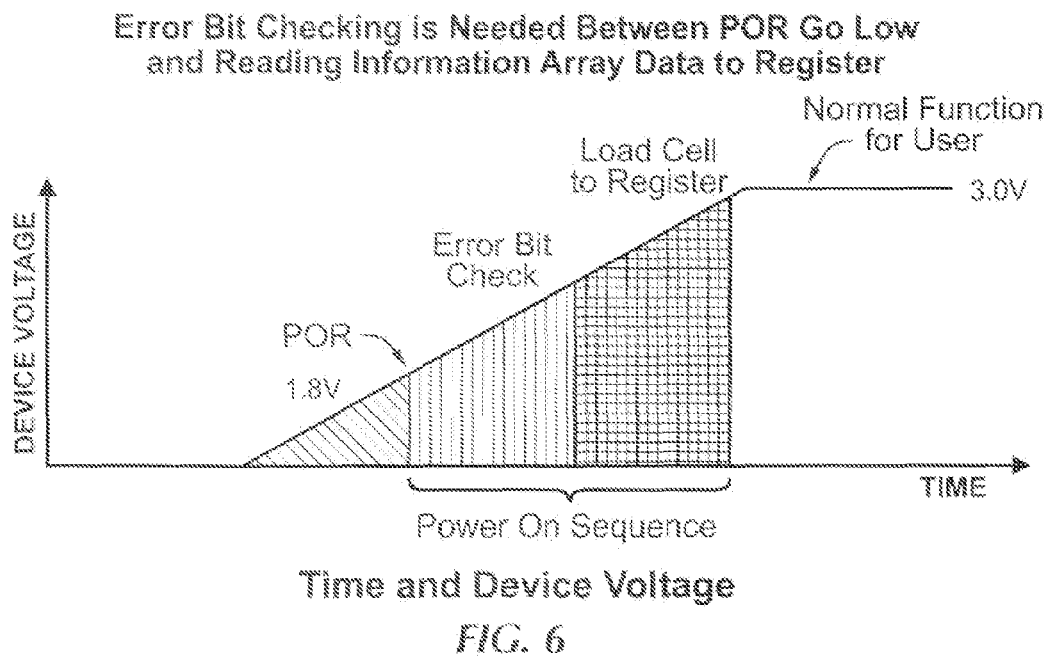
FIG. 6 is a graph depicting device voltage versus time of a power on sequence for a flash memory device in accordance with the preferred embodiment of the present invention.

As shown in FIG. 6, the power on sequence is preferably performed after the device voltage reaches a predetermined minimum voltage. The predetermined minimum voltage is less than a normal logic low voltage, but the predetermined minimum voltage is optimally greater than a minimum voltage where the device voltage is unstable. For example, the predetermined minimum voltage may be about 1.8 V and the normal logic low voltage may be about 3.0 V. The predetermined minimum voltage and the normal logic low voltage may be other values. FIG. 6 shows that the power on sequence 10 takes place after the predetermined minimum voltage is reached and includes error bit checking to determine that the device voltage is stable and loading read memory cell data to the information register 124 after the device voltage is stable.

Optionally, the method further includes determining, prior to performing the error bit check, whether to skip the power on sequence 10 including the error bit check step. If the power on sequence 10 is skipped, the information array (non-volatile memory) can be erased and/or programmed.

Preferably, an error bit check is performed on a plurality of memory cells in the flash memory device 100 during initial power up or after POR. The plurality of memory cells in the flash memory array 102 are read only after the error bit check determines that the device voltage is high enough. Data read from the plurality of memory cells are loaded to one or more information registers 124.

Figure 4:
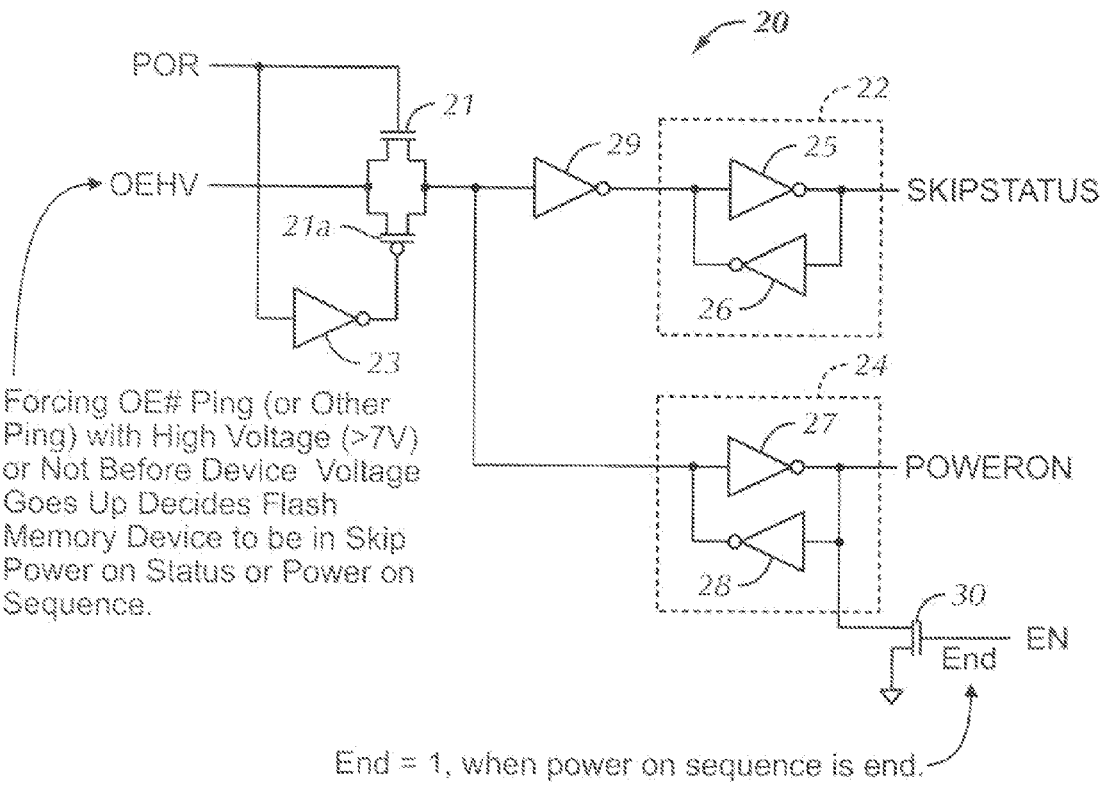
FIG. 4 is a schematic diagram of a power on sequence (POS) control circuit for a flash memory device in accordance with the preferred embodiment of the present invention.

FIG. 4 is a schematic diagram of a power on sequence (POS) control circuit 20 for a flash memory device 100 in accordance with the preferred embodiment of the present invention. The POS control circuit 20 includes a power on reset POR input and an output enable OEHV input. The POR input is applied to the gate of an n-type metal oxide semiconductor (nMOS) 21 and through an inverter 23 to p-type MOS (pMOS) 21a. The nMOS 21 and pMOS 21a are arranged as a complementary MOS pair 21, 21a. The POS control circuit 20 provides a skip status output SKIPSTATUS, a power on sequence (POS) output POWERON and an end sequence output END. POS control circuit 20 includes a first latch 22 and a second latch 24 for the skip status output SKIPSTATUS and the POS output POWERON, respectively. The first and second latches 22, 24 are each formed with reverse coupled inverter pairs 25, 26 and 27, 28, respectively. The output of the CMOS pair 21, 21a is coupled through an inverter 29 to the first latch 22 and is coupled directly to the second latch 24. An nMOS 30 is coupled between the POS output and reference or $V_{SS}$. The end sequence output END is coupled to the gate of nMOS 30 and is a logic 1 when the power on sequence 10 is finished.

Figures 5A, 5B:
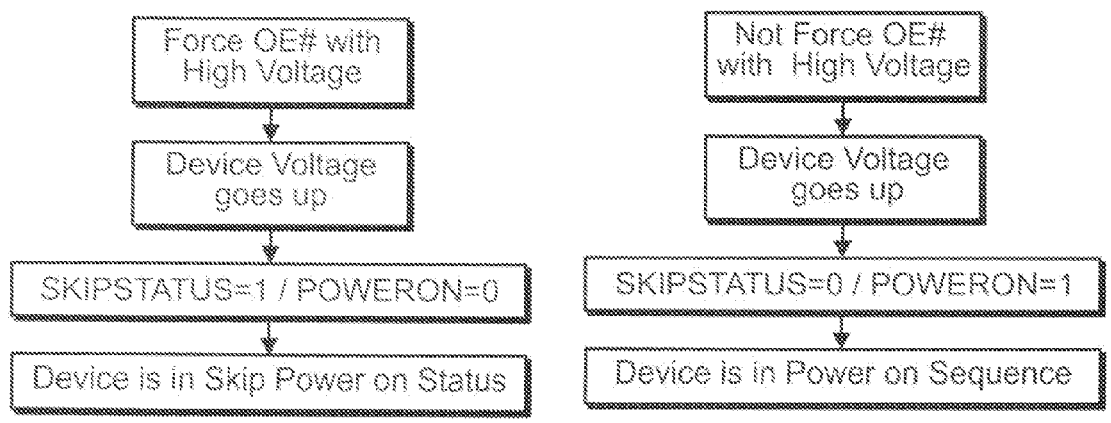
FIG. 5A is a flow chart of a power on sequence for a flash memory device using the power on sequence control circuit of FIG. 4 when POS is skipped.
FIG. 5B is a flow chart of a power on sequence for a flash memory device using the power on sequence control circuit of FIG. 4 when POS is performed.

FIG. 5A is a flow chart of a power on sequence 10 for a flash memory device 100 using the POS control circuit 20 of FIG. 4 when error checking is skipped. A "#" represents a type of signal which turns active when the input is at low level. When the output enable OE# input is forced with a high voltage and the POR is in a high state, the device voltage increases, the skip status output SKIPSTATUS is logical "1" and the POS output POWERON is logical "0." The power on sequence 10 including error checking is thereby skipped.

FIG. 5B is a flow chart of a power on sequence 10 for a flash memory device 100 using the POS control circuit 20 of FIG. 4 when error checking is performed. When the output enable OEHV input is not forced with a high voltage and the POR is in a high state, the device voltage increases, the skip status output SKIPSTATUS is logical "0" and the POS output POWERON is logical "1." The power on sequence 10 including error checking is thereby performed.

Figure 7:
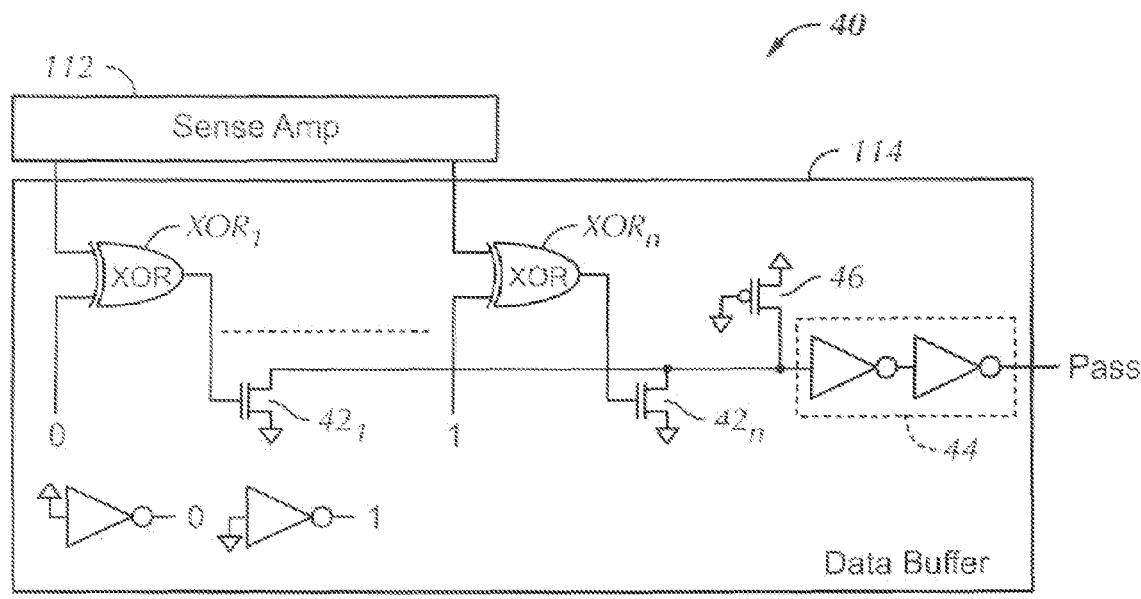
FIG. 7 is a schematic diagram of an error bit check circuit for a flash memory device in accordance with the preferred embodiment of the present invention.

FIG. 7 is a schematic diagram of a an error bit check circuit 40 for a flash memory device 100 in accordance with the preferred embodiment of the present invention. The error bit check circuit 40 is within the data buffer 114 which is coupled to the sense amp 112 of the conventional flash memory device 100. The error bit check circuit 40 includes an output line PASS. The error bit check circuit 40 includes a plurality of exclusive or gates XOR1-XORn. The output of each XOR gate XOR1-XORn drives the gate of a respective nMOS transistor $41_1$-$42_n$. Each of the nMOS transistors $41_1$-$42_n$ is coupled between an input to a pass double-inverter buffer 44 and reference or $V_{SS}$. Each of the XOR gates XOR1-XORn compares the data of a sensed memory cell. If the data of the sensed memory all matches the expected data, PASS will be logic high. A weal pMOS transistor 46 is coupled between the input of the double-inverter buffer 44 and a high potential or $V_{CC}$. The gate of the pMOS transistor 46 is coupled to reference or $V_{SS}$. If read or sensed data is the same as the initial data, the output line PASS will be a logic "1," which means that the sense amp 112 is ready and the sensing data is stable. Otherwise, if any of the read or sensed data is not the same as the initial data, the output line PASS will be a logic "0," which means that the sensing data is not yet stable and should not be loaded yet.

From the foregoing, it can be seen that the present invention comprises a power on sequence for a flash memory device that includes error bit check before reading data. It will be appreciated by those skilled in the art that changes could be made to the embodiments described above without departing from the broad inventive concept thereof. It is understood, therefore, that this invention is not limited to the particular embodiment disclosed, but it is intended to cover modifications within the spirit and scope of the present invention as defined by the appended claims.

We claim:

1. A method of performing a power on sequence for a flash memory, the method comprising:
    applying a device voltage to the flash memory;
    performing an error bit check on at least one memory cell in the flash memory during power up;
    reading the at least one memory cell in the flash memory only after the error bit check determines that the device voltage is stable; and
    loading the data read from the at least one memory cell to an information register.

2. The method according to claim 1, wherein the power on sequence is performed after the device voltage reaches a predetermined minimum voltage.

3. The method according to claim 2, wherein the predetermined minimum voltage is less than a normal logic low voltage.

4. The method according to claim 3, wherein the predetermined minimum voltage is about 1.8 V and the normal logic low voltage is about 3.0 V.

5. The method according to claim 1, further comprising:
    determining, prior to performing the error bit check, whether to skip the error bit check step.

6. The method according to claim 1, wherein a complementary metal oxide semiconductor (CMOS) pair and an inverter determine when the power on sequence should be skipped.

7. The method according to claim 1, wherein at least one exclusive OR gate (XOR) is used to perform the error bit checking.

8. A method of performing a power on sequence for a flash memory, the method comprising:
    applying a device voltage to the flash memory;
    performing an error bit check on a plurality of memory cells in the flash memory during power up;
    reading the plurality of memory cells in the flash memory only after the error bit check determines that the device voltage is stable; and
    loading the data read from the plurality of memory cells to one or more information registers.

9. The method according to claim 8, wherein the power on sequence is performed after the device voltage reaches a predetermined minimum voltage.

10. The method according to claim 9, wherein the predetermined minimum voltage is less than a normal logic low voltage.

11. The method according to claim 10, wherein the predetermined minimum voltage is about 1.8 V and the normal logic low voltage is about 3.0 V.

12. The method according to claim 8, further comprising:
    determining, prior to performing the error bit check, whether to skip the error bit check step.

13. The method according to claim 8, wherein a complementary metal oxide semiconductor (CMOS) pair and an inverter determine when the power on sequence should be skipped.

14. The method according to claim 8, wherein at least one exclusive OR gate (XOR) is used to perform the error bit checking.

* * * * *